United States Patent
Menon et al.

(10) Patent No.: US 10,845,413 B2
(45) Date of Patent: *Nov. 24, 2020

(54) INTERFACES FOR WIRELESS DEBUGGING

(71) Applicant: Intel IP Corporation, Santa Clara, CA (US)

(72) Inventors: Sankaran M. Menon, Austin, TX (US); Bradley H. Smith, Vancouver, WA (US); Jinshi Huang, Fremont, CA (US); Rolf H. Kuehnis, Portland, OR (US)

(73) Assignee: Intel IP Corporation, Santa Clara, CA (US)

( * ) Notice: Subject to any disclaimer, the term of this patent is extended or adjusted under 35 U.S.C. 154(b) by 179 days.

This patent is subject to a terminal disclaimer.

(21) Appl. No.: 15/980,409

(22) Filed: May 15, 2018

(65) Prior Publication Data
US 2018/0328987 A1 Nov. 15, 2018

Related U.S. Application Data

(63) Continuation of application No. 14/975,685, filed on Dec. 18, 2015, now Pat. No. 9,989,592.

(51) Int. Cl.
*G06F 11/00* (2006.01)
*G01R 31/3177* (2006.01)
(Continued)

(52) U.S. Cl.
CPC ... *G01R 31/3177* (2013.01); *G01R 31/31703* (2013.01); *G01R 31/31705* (2013.01); *G01R 31/31722* (2013.01); *H04W 4/80* (2018.02)

(58) Field of Classification Search
CPC .......... G01R 31/3177; G01R 31/31703; G01R 31/31705; G01R 31/31722; G06F 11/3656; G06F 11/3664
See application file for complete search history.

(56) References Cited

U.S. PATENT DOCUMENTS

| | | |
|---|---|---|
| 7,383,478 B1 | 6/2008 | Ballagh et al. |
| 7,752,359 B2 | 7/2010 | Ooi |

(Continued)

OTHER PUBLICATIONS

International Search Report and Written Opinion dated May 5, 2017 for International Application No. PCT/US2016/066736, 10 pages.

(Continued)

*Primary Examiner* — Elmira Mehrmanesh
(74) *Attorney, Agent, or Firm* — Alliance IP, LLC

(57) ABSTRACT

Existing multi-wire debugging protocols, such as 4-wire JTAG, 2-wire cJTAG, or ARM SWD, are run through a serial wireless link by providing the debugger and the target device with hardware interfaces that include UARTs and conversion bridges. The debugger interface serializes outgoing control signals and de-serializes returning data. The target interface de-serializes incoming control signals and serializes outgoing data. The actions of the interfaces are transparent to the inner workings of the devices, allowing re-use of existing debugging software. Compression, signal combining, and other optional enhancements increase debugging speed and flexibility while wirelessly accessing target devices that may be too small, too difficult to reach, or too seal-dependent for a wired connection.

23 Claims, 7 Drawing Sheets

(51) Int. Cl.
*H04W 4/80* (2018.01)
*G01R 31/317* (2006.01)

(56) References Cited

U.S. PATENT DOCUMENTS

| | | | |
|---|---|---|---|
| 7,836,342 | B2 | 11/2010 | Pirttimaki et al. |
| 8,140,900 | B2 | 3/2012 | Yang et al. |
| 8,548,767 | B2 | 10/2013 | Holzmann et al. |
| 9,989,592 | B2 * | 6/2018 | Menon ............. G01R 31/31705 |
| 2002/0133794 | A1 | 9/2002 | Kanapathippillai et al. |
| 2005/0240822 | A1 | 10/2005 | Miyamoto |
| 2009/0150728 | A1 | 6/2009 | Barlow et al. |
| 2012/0239339 | A1 | 9/2012 | Kaneko |
| 2015/0302126 | A1 | 10/2015 | Hamid et al. |

OTHER PUBLICATIONS

Non-Final Office Action dated Jul. 12, 2017 for U.S. Appl. No. 14/975,685, 12 pages.
Notice of Allowance dated Feb. 12, 2018 for U.S. Appl. No. 14/975,685, 7 pages.
Notice of Allowance dated Apr. 4, 2018 for U.S. Appl. No. 14/975,685, 2 pages.

* cited by examiner

INTERFACES FOR WIRELESS DEBUGGING

RELATED APPLICATIONS

The present application is a continuation application, and claims priority to U.S. patent application Ser. No. 14/975,685, filed Dec. 18, 2015, entitled "INTERFACES FOR WIRELESS DEBUGGING", now U.S. Pat. No. 9,989,592; the entire disclosure of which is hereby incorporated by reference.

FIELD

Related fields include debugging, particularly debugging of platforms, systems and devices over a wireless link.

BACKGROUND

Debugging conventional systems which incorporate system-on-chip and integrated circuits typically require them to be connected to a debugger device using one or more cables. The form-factors of these systems and platforms are becoming smaller for each generation. Likewise, the number of wired-ports or pins on these systems have drastically reduced such that many of these devices do not have wired ports or pins for debugging purposes. Due to this trend, a new debugging solution is needed. The present disclosure addresses this need.

BRIEF DESCRIPTION OF DRAWINGS

To facilitate understanding, identical reference numerals have been used, where possible, to designate identical elements that are common to the drawings. The present disclosure may readily be understood by considering the following detailed description with the accompanying drawings which are not necessarily drawn to scale, in which.

DETAILED DESCRIPTION

The description of the different advantageous embodiments has been presented for purposes of illustration, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure.

In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1A:
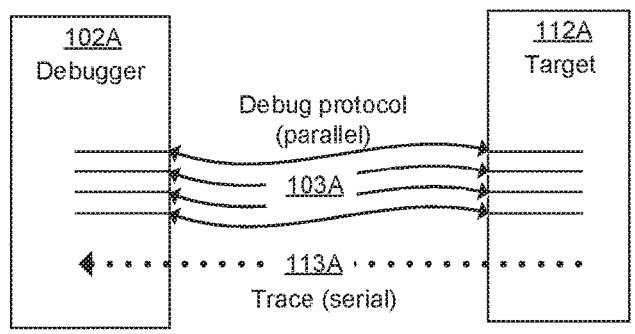
FIGS. 1A and 1B schematically illustrate wired and wireless debugging arrangements.

FIG. 1A illustrates a conventional wired debugging configuration. By way of non-limiting example, a debugger device 102A establishes a multi-wire connection with a target device (device under test) 112A. Debugger 102A formulates control signals in a multi-wire debug protocol 103A and sends them over the multi-wire connection. For example, debug protocol 103A may be Joint Test Action Group (JTAG), which uses 4 wires, or compact Joint Test Action Group (cJTAG), which uses 2 wires.

Target 112A understands and reacts to debug protocol 103A commands as sent over the multi-wire connection. For example, target 112A may respond with readouts of the values presently in the requested registers. Short responses, such as a few bytes, may be sent back to debugger 102A over the multi-wire connection. However, lengthy responses such as a data dump from a large memory array may be sent back to the debugger on a separate channel as a serial bit stream such as trace signal 113A.

Figure 1B:
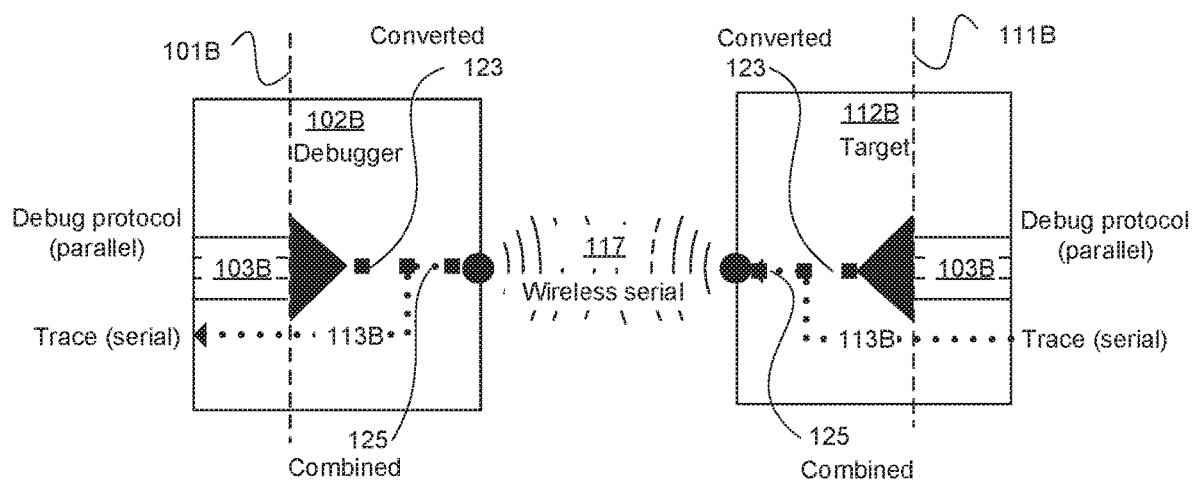

FIG. 1B illustrates a wireless debugging configuration. Debugger 102B and target 112B, no longer connected by a multi-wire connection, cannot send or receive debug protocol 103A signals as generated. Instead, Bluetooth® (which is intended to include Bluetooth Low-Energy, known as BTLE) and similar wireless technologies send and receive serial bit streams such as wireless serial signal 117. Providing a separate wireless link to replace each of the parallel wires in FIG. 1A may add to production cost and be cumbersome to pair correctly and protect from crosstalk. Alternatively, serial control protocols exist, such as those formerly sent over wired RS-232 connections. However, their speed, versatility, and pervasiveness of adoption may fall short of the achievements of multi-wire debugging protocols. In addition, in many scenarios where the devices are of small form factor or implanted inside a patient's body, the debug targets may not be physically accessible by wired connectors. A wireless solution compatible with existing multi-wire debugging protocols may be desirable. A way to debug target devices through asynchronous interfaces as well as the usual serial-synchronous interfaces may also be beneficial.

Debugger 102B generates commands in multi-wire debug protocol 103B, but then converts them to serial-converted signal 123. Serial-converted signal 123 is transmitted to target 112B as wireless serial signal 117. Target 112B receives wireless serial signal 117 and recovers serial-converted signal 123. Then, the conversion process is reversed to yield the original debug protocol 103B commands and distribute them among a plurality of compatible wires.

From there, individual registers, groups of registers, and memory arrays on target 112B are read. Some of the values are carried back along the wires distributing debug protocol 103B. Other values coming from locations referred to as "trace sources" (memory arrays and the like) are routed along a data pipe as a serial trace signal 113B. Trace signal 113B is combined (e.g., multiplexed) with the returning converted serial signal 123 to form combined serial signal 125. Combined serial signal 125 is transmitted back to debugger 102B as wireless serial signal 117.

Debugger 102B receives returning wireless serial signal 117 and recovers combined serial signal 125. Combined serial signal 125 is separated (e.g., de-multiplexed) into serial-converted signal 123 and trace signal 113B. Finally, serial-converted signal 123 is reverse-converted to debug protocol 103B data, which is distributed among a plurality of compatible wires.

The section of debugger 102B to the left of line 101B has the same types of inputs and outputs as wired debugger 102A. Moreover, the part of target 112B to the right of line 111B has the same inputs and outputs as wired target 112A. In some embodiments, the interfaces between line 101B and line 111B may be added to existing debuggers and targets originally designed for wired use which may be faster and less expensive to implement than a fully redesigned SoC or IC. Also, the new interface may be made transparent to software that presently runs on the processors of debugger 102 and target 122 so that much, or even all, existing software may be re-used to reduce development cost.

FIGS. 2A-2E illustrate examples of target devices that could benefit from wireless debugging. In general, an increasing number of miniature and embedded devices are difficult to reach with wired connectors. In-situ diagnostics and debugging in the field could be particularly aided by wireless processes.

Figure 2A:
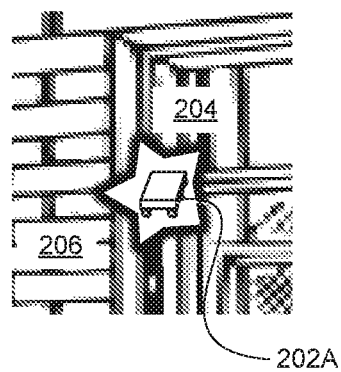
FIGS. 2A-2E illustrate examples of target devices that could benefit from wireless debugging.

In FIG. 2A, chip 202A is built into architectural material such as frame 204 of a smart-glass window for a building 206. A wired port may function as an unwanted collector of moisture or dust. Large household appliances with smart or connected features may also have difficult-to-reach electronics.

Figure 2B:
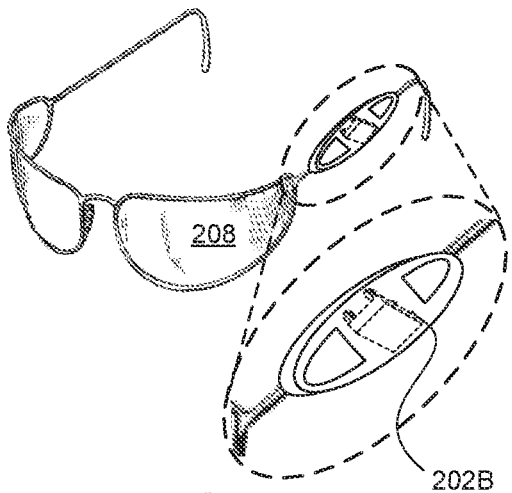

In FIG. 2B, smart glasses 206 have chip 202B in a very small control/power module that would have to be larger and heavier to accommodate a wired connection.

Figure 2C:
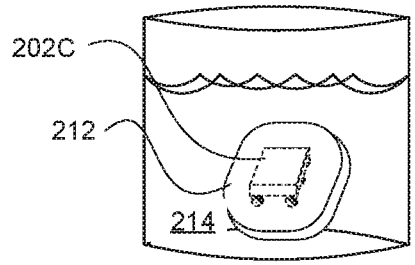

In FIG. 2C, chip 202C is in a sealed module 212. Where sealing is function-critical, such as in liquid environment 214, a wired connector that has to remain accessible is a likely point of failure.

Figure 2D:
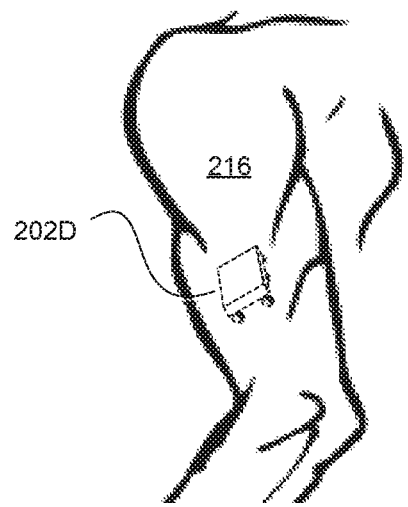

In FIG. 2D, chip 202D is part of a medical implant. Devices positioned inside a body 216 may be safer and easier to live with if they do not require repeated through-the-skin access.

Figure 2E:
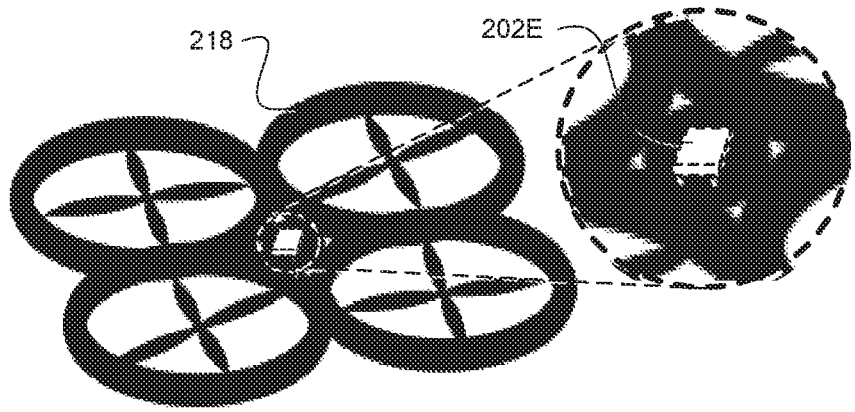

In FIG. 2E, chip 202E is built into drone 218. With wireless debugging, chip 202E could potentially be debugged from a remote debugger while drone 218 is in flight performing a task or landed in a difficult-to-access location. Some drones also may be too small for a conventional wired connector or, like chip 202E in FIG. 2C, may need to be sealed for reliability or safety.

Wireless debugging may also be done at a distance; for instance, by transmitting the debugging signals first over a cellular phone network from the support office to the customer site, then from the customer's phone to the device over Bluetooth, BTLE, WiFi, or some other wireless technology common to the device and the customer's phone. In this case, the debugger may be running at the support office and the serial signals will be further transmitted, as packetized data, from the customer's phone to the support office before converting back to the debug protocol and trace. Desirable characteristics of a suitable wireless technology for wireless debugging include (1) staying on indefinitely after being activated, (2) low power consumption or overhead in case of a target device or debugger with a low battery, and (3) activation as soon as possible after the target device is powered to detect boot-disabling bugs.

Figure 3:
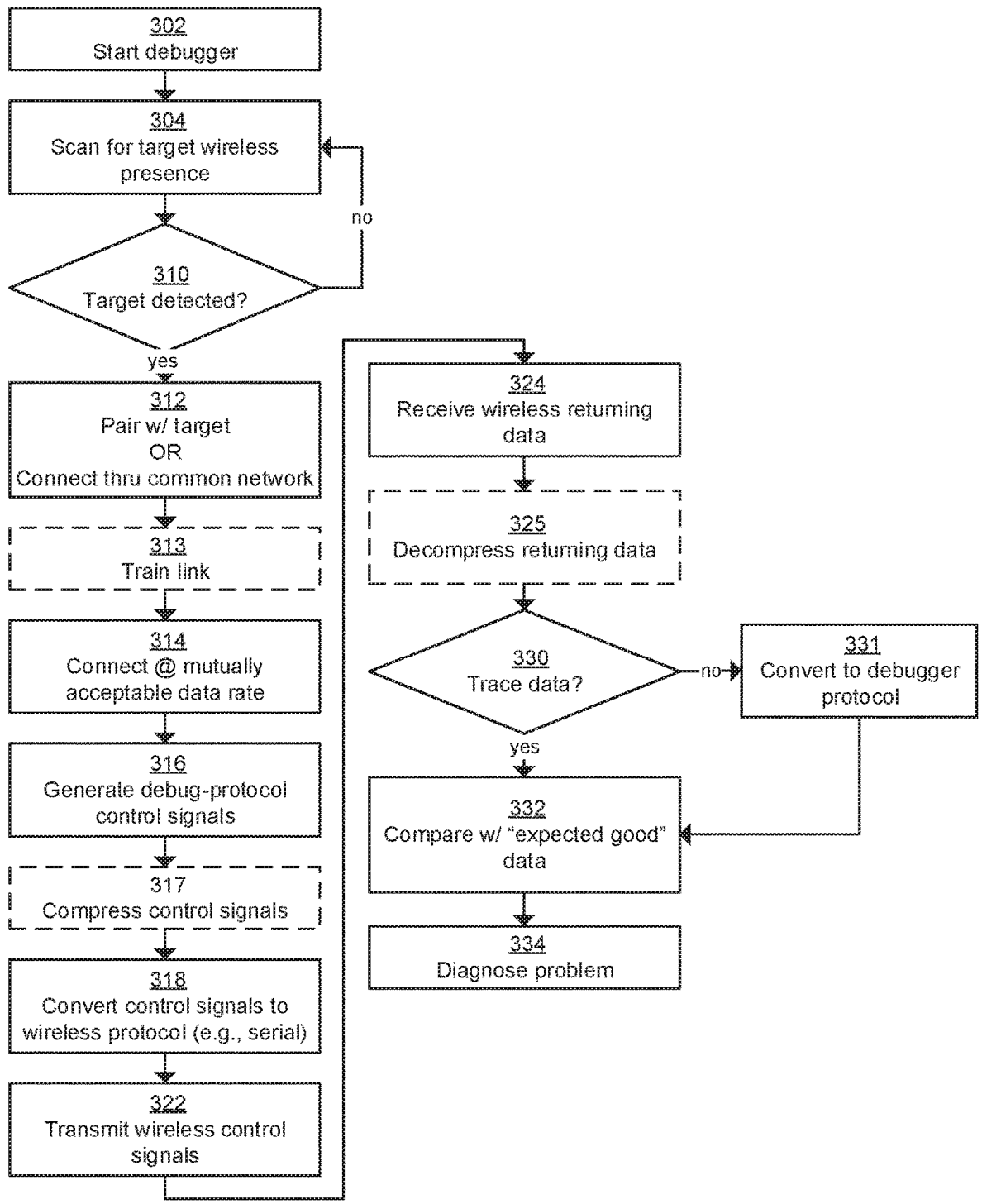
FIG. 3 is a flowchart for a debugger implementing wireless debugging.

FIG. 3 is a flowchart for a debugger implementing wireless debugging. At block 302, the debugger has started and scans for a target's wireless presence. If a target is not detected at decision 310, the scanning continues at block 311 until a target is detected. When a target is detected, the debugger pairs with the target or connects with it through a common network at block 312 so communication can begin. For example, some current WiFi links may depend on a common network, and in some situations such as enterprise IT or a network provider servicing its own equipment the common network is already in place. As another example, some current Bluetooth links are network-independent and use ad-hoc pairing to create connections.

At block 313, link training occurs if needed to negotiate the data rate for communication between the debugger and target. If the debugger and target communicate at a common fixed rate, link training is not needed. However, a variable data rate may advantageously enable debugging and testing at a lower data rate than normal high-speed operation. At block 314, the debugger and target establish communication at a mutually acceptable data rate, whether fixed or trained.

At block 316, the debugger generates or retrieves debug-protocol control signals for the desired debugging process. The process may be retrieved from storage or defined by real-time input from an operator. The debug protocol may be a multi-wire protocol such as JTAG or cJTAG. At block 318, the control signals are converted to a wireless protocol (e.g., a serial protocol such as Bluetooth/BTLE). Optionally, the control signals may be compressed at block 317 after, before, or concurrently with the serial conversion of block 318. At block 322, the wireless control signals are transmitted from the debugger to the target.

The next task for the debugger is to receive the data being returned from the target at block 324. Serial trace data from data-intensive sub-processes such as memory dumps may arrive through the same port as serialized multi-wire data returning along the control-signal path, or through a different port. If the data is compressed, the debugger may decompress it at block 325. At decision 330, incoming trace data may be directly compared with stored known-good or expected values at block 332, and non-trace data may be converted back to debug protocol at block 331 before analysis. When enough data has been evaluated, the debugger may output a diagnosis of the target at block 334.

Figure 4:
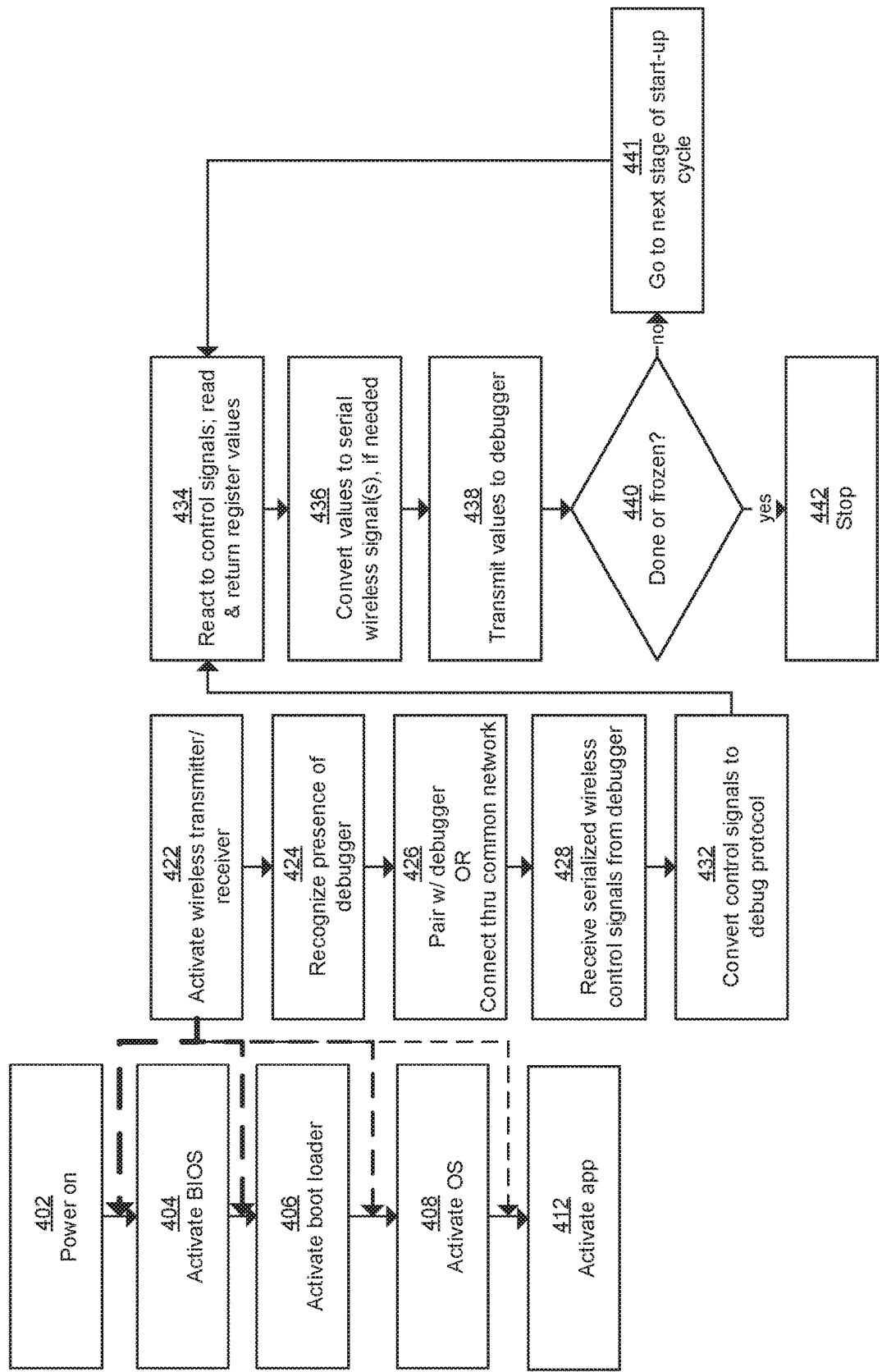
FIG. 4 is a flowchart for a target device undergoing wireless debugging.

FIG. 4 is a flowchart for a target device undergoing wireless debugging.

Blocks 402-12 provide examples of stages in the target's boot or start-up process. Power comes on at block 402, the basic input/output system (BIOS) loads at block 404, a boot loader is activated at block 406, the operating system (OS) loads at block 408, and applications load at block 412.

At block 422, activation of the wireless transmitter/receiver that will communicate with the debugger can occur between or during any of these stages to allow the debugging of later processes. However, because errors can occur at any point in start-up, it may be preferable to activate the wireless transmitter/receiver as early as possible to enable debugging of a maximum range of operational stages. For example, a dedicated embedded controller may activate immediately upon power-up to start the wireless transmitter/receiver. Some systems already activate a wireless transmitter/receiver very early to take advantage of wireless battery charging even if the battery is largely drained; this capability can be leveraged for low-level and low-power debugging.

At block 424, the wireless transmitter/receiver senses the wireless presence of the debugger. At block 426, the wireless transmitter/receiver connects with the debugger by ad-hoc pairing or over a shared network. Pairing is a more versatile approach, but there are situations where a debugger and its targets can almost always access a shared network. At block 428, the target wireless transmitter/receiver receives serialized wireless control signals from the debugger.

At block 432, the target converts the serialized wireless control signals into debug-protocol control signals. In some embodiments, the target debug protocol may be JTAG, cJTAG, Universal Asynchronous Receiver/Transmitter (UART), Serial Peripheral Interface (SPI), Inter-Integrated Circuit (I2C), or Serial Wire Debug (SWD). At block 434, the target reacts to the debug-protocol control signals, e.g., by reading register values to transmit back to the debugger for evaluation. At block 436, the register values are converted to serial wireless signal(s) and as such they are transmitted to debugger at block 438. At decision 440, if the process finishes or if the target hangs or freezes before the process is finished, the process stops at block 442. If not, the debugging process continues at block 441 as the target proceeds to the next stage of its start-up cycle.

Figure 5:
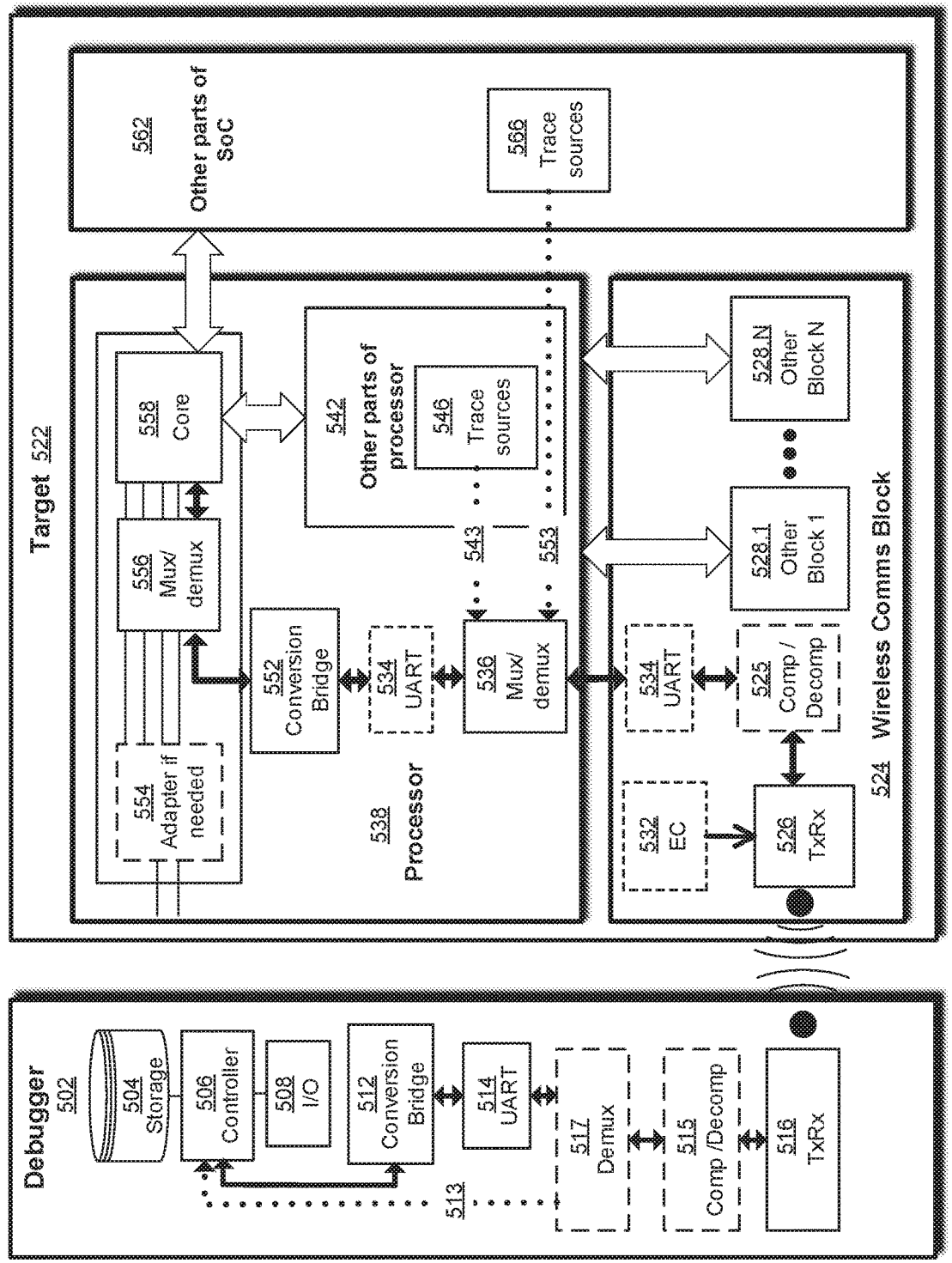
FIG. 5 is a block diagram of a debugger and target configured for wireless debugging.

FIG. 5 is a block diagram of a debugger and target configured for wireless debugging. Individual blocks in the diagram may represent individual components, groups of components, or parts of components in various alternative embodiments.

In debugger 502, debugger controller 506 may receive instructions from an operator through debugger input/output interface 508. Alternatively, debugger controller 506 may automatically load a program from storage 504. The instructions or program may use a multi-wire protocol such as JTAG or cJTAG. Other suitable protocols may include Device Communications Interface (DCI), Virtualization of Internal Signals Architecture (VISA), Mobile Industry Processor Interface (MIPI) STP or TWP protocols, or other serial or multi-wire protocols.

Debugger controller 506 sends the debug-protocol control signals to debugger conversion bridge 512 to be serialized in preparation for wireless transmission. The resulting serial-converted signal is routed through a debugger UART 514 that controls debugger 502's serial communication with target 522. Debugger de-multiplexer 517 may be present if the incoming serial-converted data stream and the incoming trace data stream 513 share a single port and would otherwise become so intermixed as to obfuscate the trace-source registers on the target that produced each value or set of values. For the outgoing control signals, debugger de-multiplexer 517 would act as a pass-through if there is no other outgoing signal.

In some embodiments, debugger compressor/decompressor 515 may be present, compressing outgoing signals and decompressing compressed incoming signals. In models and experiments, gains in debugging speed are in direct proportion to the amount of compression, at least up to 50× compression. This indicates that, at least in this range, the time taken by the extra operations of compressing the outgoing control signal at debugger 502, decompressing it when it arrives at target 522, compressing the returning data at target 522, and decompressing it when it arrives at debugger 502 is insignificant compared to the time saved by sending a smaller number of bits across the wireless link.

Both the debugger and the target preferably are configured to use the same algorithm for compression and decompression. For example, LZ4, an open-source compression algorithm usually used in databases or for increasing hard-drive space or bandwidth without changing hardware, may be re-purposed for use in wireless debugging. Other candidate algorithms, like LZ4, are not computationally intensive; although firmware-based, their overhead is very small. For example, the entire algorithm may occupy 1 KB of read-only memory (ROM) or less.

Compressing all the data exchanged over the link in both directions has been shown to produce a net gain of 10×-50× in debugging speed. This may make up for some of the speed disadvantages of some of the ad-hoc-pairing wireless technologies such as Bluetooth, which may be 100-1000× slower than technologies requiring a common network such as WiFi.

The serialized control signals are converted to wireless serial signals transmitted by debugger wireless transmitter/receiver 516 and received by target wireless transmitter/receiver 526. Target wireless transmitter/receiver 526 may be located on target wireless communication block 524 along with other blocks 528.1-528.N. For example, target wireless communication block 524 may include transmitters and receivers for Bluetooth (BT), Wireless Fidelity (WiFi), Global Positioning System (GPS), Near Field Communication (NFC), other RF signals, and/or other free-space signals such as infrared.

Target embedded controller 532 may be provided in some embodiments to activate target wireless transmitter/receiver 526 independently of target processor 538. If target embedded controller 532 activates target wireless transmitter/receiver 526 very early (or even first) as the target starts up, giving debugger 502 access to register errors that may occur early in the boot cycle so that target 522 fails before target processor 538 can load the operating system or applications.

After reception at the target, the control signals revert to their wired serialized form. Target compressor/decompressor 525 may be present to accommodate compressed incoming control signals and to compress outgoing data streams. Target UART 534 may be located either upstream or downstream of first target multiplexer/de-multiplexer 536, as part of target wireless communication block 524 or of target processor 538. In some embodiments, target wireless communication block 524 may be integrated with target processor 538. Alternatively, target wireless communication block 524 and target processor 538 may be on different parts of the same chip, or on two different chips.

A first target multiplexer/de-multiplexer 536 is a pass-through for received control signals. Target conversion bridge 552 recovers the control signals in their original multi-wire form. A second target multiplexer/de-multiplexer 556 mixes the recovered control signals with other signal channels going into target processor core 558, allowing the recovered control signals to bypass any adapters 554, if present, that convert input and output of target processor core 558 to different protocols. The recovered control signals cause target processor core 558 to read its own internal registers, if any, and then to read registers in other parts 542 of target processor 538 and other parts 562 of the target SoC or IC 522.

Data from smaller groups of registers, such as status registers, may be sent in a reverse direction along the path of the control signals. Larger groups of registers, such as memory arrays, act as trace sources 546 and 556 and output trace data streams 343 and 353, which may travel in one or more paths that, at least in places, do not coincide with the control-signal path. The returning data paths meet at first target multiplexer/de-multiplexer 536, which mixes them into a single returning data stream.

The combined data stream goes through target UART 534 in embodiments where target UART 534 is closer than first target multiplexer/de-multiplexer 536 to target wireless transmitter/receiver 526. If target compressor/decompressor 525 is present, it compresses the returning combined data stream. The returning combined data stream is then converted to a wireless data stream and transmitted from target wireless transmitter/receiver 526 back to debugger wireless transmitter/receiver 516 to be analyzed by debugger 502.

Alternatively, the constituent returning data streams may continue on separate paths and be transmitted and received through separate ports.

The returning data received at debugger wireless transmitter/receiver 516 is decompressed, if needed, by debugger compressor/decompressor 515, if present. Combined returning data streams may be separated, if needed, by debugger de-multiplexer 517, if present. The trace signal 513, which was serial at its sources, goes directly to debugger controller 506 while the signal returning along the control-signal path goes through debugger UART 514 to be converted to its original form by debugger conversion bridge 512 before being routed to debugger controller 506. Debugger controller 506 may analyze the data and provide the result to the operator through debugger input/output interface 508. Additionally or alternatively, debugger controller 506 may store the data in storage 504 for later reference.

Figure 6:
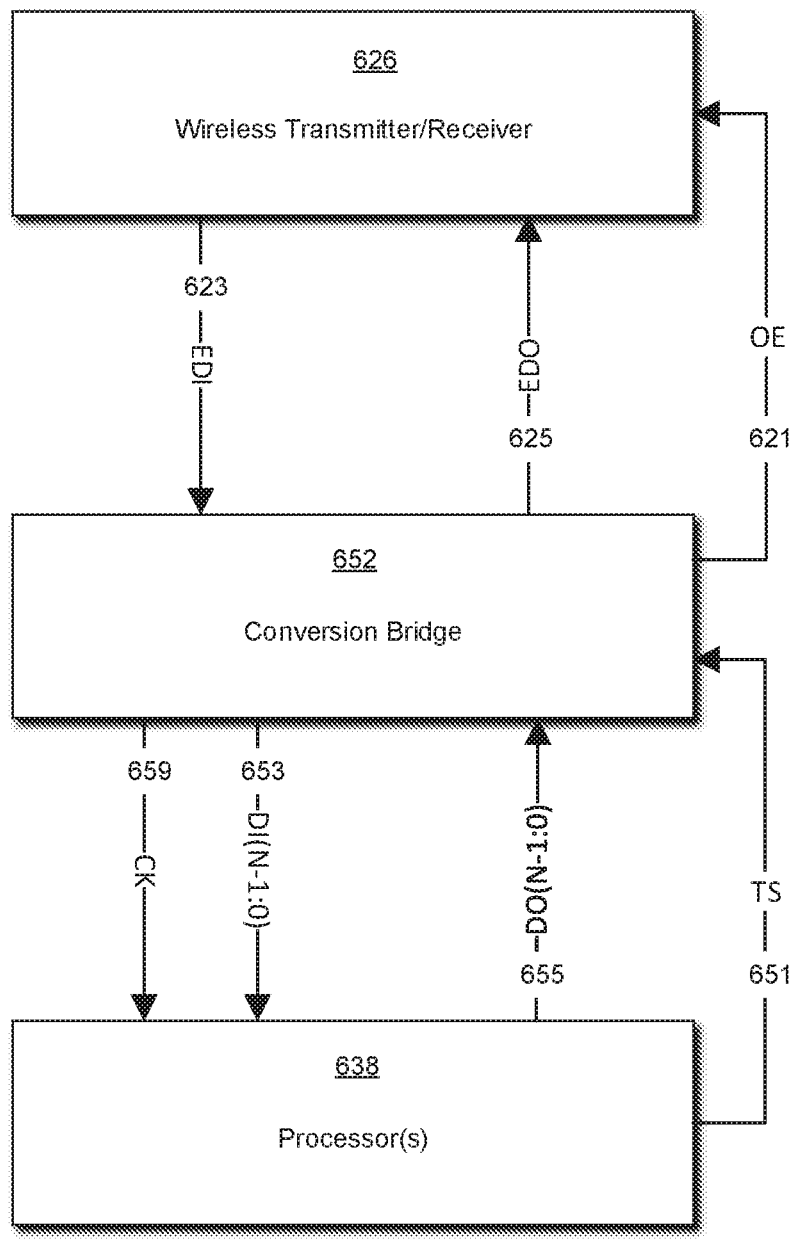
FIG. 6 is a block diagram of inputs and outputs in a conversion bridge.

FIG. 6 is a block diagram of inputs and outputs in a conversion bridge. This diagram could apply to the debugger or the target. Wireless transmitter/receiver 626 provides serial data in (EDI) 623 to conversion bridge 652. In response, conversion bridge 652 provides clock-edge (CK) 659 with converted data (DI(N-1:0)) 653 to processor 638. Each EDI symbol sent is converted to a clock event and an associated data set 1 or more bits wide. For each data set sent from conversion bridge 652 to processor 638, processor 638 returns a data set with the same number of bits. This logic enables an ordinary "data pipe" link to control virtually any type of debug hardware.

When target processor 638 outputs data (DO(N-1:0))655 to conversion bridge 652, conversion bridge 652 outputs corresponding serial data (EDO) 625. Additionally processor 638 provides an indicator of its state (TS) 651 to conversion bridge 652, which uses selected TS values to control the output-enable function (OE) 621 on wireless transmitter/receiver 626. In some embodiments, wireless transmitter/receiver 626 is only allowed to transmit data when the processor is in certain states.

Figure 7:
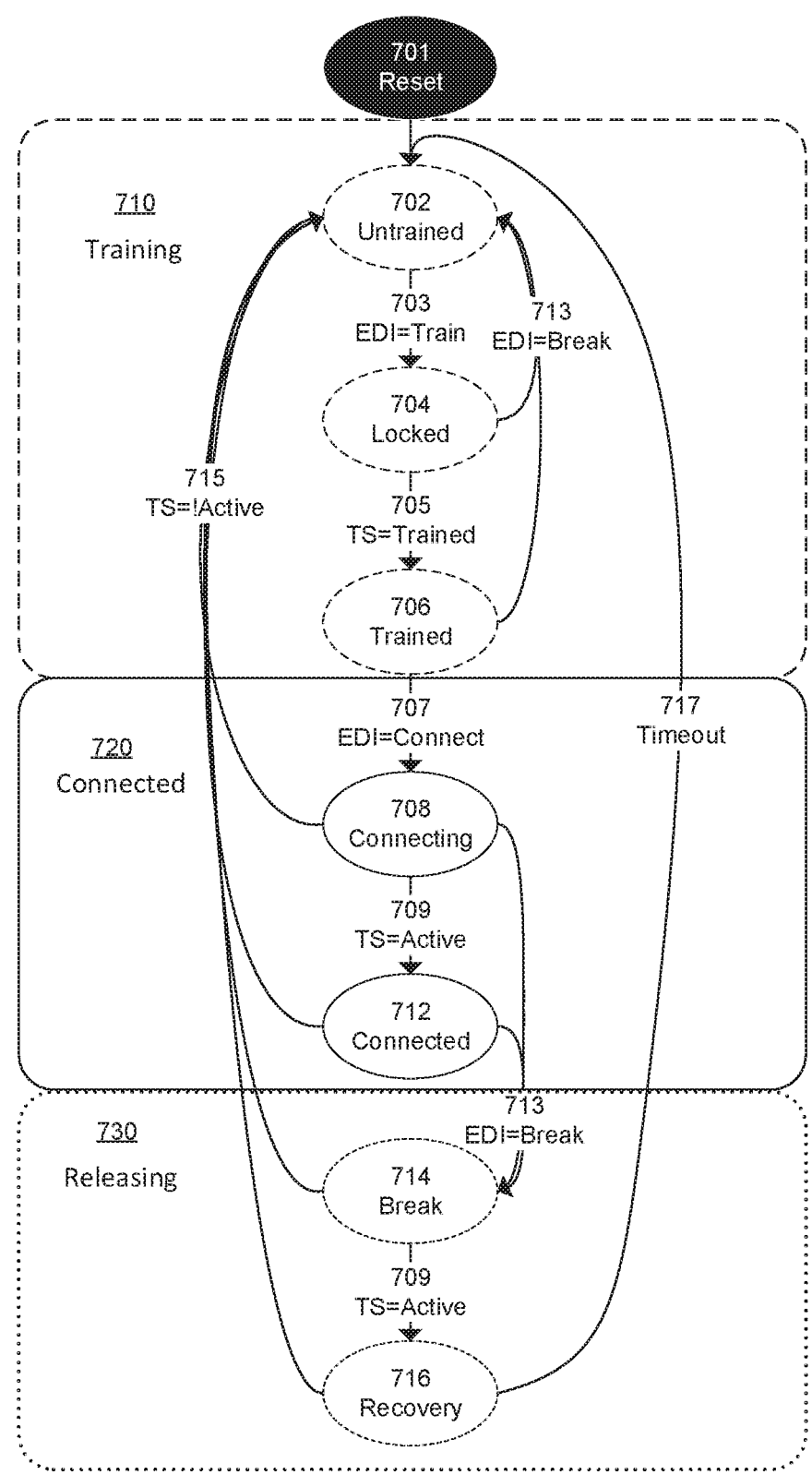
FIG. 7 is a state diagram of a UART JTAG tunneling protocol.

FIG. 7 is a state diagram of a UART JTAG tunneling protocol. This non-limiting example describes one way to use a hardware state machine to establish and manage a wireless link data pipe between a debugger and a target. Attention to a process for establishing the link may be important; if the debugger begins sending commands before the target is ready to receive them, the commands may be ignored or data may be lost.

The states, other than Reset, may be divided into three groups. Training state group 710 includes the sequence for establishing communication between the target and the debugger at a mutually compatible frequency. Connecting state group 720 includes the exchange of debugging information over the established communication link. Releasing or "un-training" section 730 includes breaking the connection, releasing the link, and recovering the link if needed.

The debugger and the target may need to be ready to communicate at the same frequency. In older RS232 links, the problem was addressed by operating both devices at a single fixed frequency. Alternatively, if the communicated data from the debugger to the target (or vice versa) were to be accompanied by a clock signal, the clock might be ramped to any frequency. However, many current debuggers and targets can operate at two or more frequencies and many widely used wireless technologies do not include passing a clock signal from one device to the other. Link training is one approach to negotiating a frequency for the debugging link. One advantage of not using a fixed frequency is that debugging and other kinds of testing can be done at a lower frequency (i.e., slower speed) than normal operation.

After Reset 701, the system is in Untrained state 702. From Untrained state 702, receiving the "EDI=Train" (Incoming Request for Training) signal 703 may trigger a change to Locked state 704, in which the debugger and target have locked onto a mutually selected frequency. In some embodiments, link quality testing and/or handshake processes may also be part of this stage.

From Locked state 704, receiving the "TS=Trained" (Target System Trained) signal 705 may trigger a change to Trained state 706, in which the signal integrity is established via a loopback stage. Alternatively, from Locked state 704, receiving the "EDI=Break" (Incoming Request for Disconnection) signal 713 may trigger a change back to Untrained state 702 to restart the training process.

From Trained state 706, receiving the "EDI=Connect" (Incoming Request for Connection) signal 707 may trigger a change to Connecting state 708, in which the debugger and target exchange preliminary messages to begin the debugging process. Alternatively, from Trained state 706, receiving the "EDI=Break" signal 713 may trigger a change back to Untrained state 702 to restart the training process.

From Connecting state 708, receiving the "TS=Active" (Target System Active) signal 709 may trigger a change to Connected state 712 in which quanta of information are exchanged between the UART and JTAG-responsive parts of the target, each including a clock-edge and a predetermined number of bits. Alternatively, from Connecting state 708, receiving the "EDI=Break" signal 713 may trigger a change to Break state 714, in which the link is disconnected. Alternatively, from Connecting state 708, receiving the "TS=!Active" (Target System Not Active") signal 715 may trigger a change back to Untrained state 702 to restart the training process.

From Connected state 712, receiving the "EDI=Break" signal 713 may trigger a change to Break state 714, in which the link is disconnected. Alternatively, from Connected state 712, receiving the "TS=!Active" signal 715 may trigger a change back to Untrained state 702 to restart the training process.

From Break state 714, receiving the "TS=Active" signal 709 may trigger a change to Recovery state 716, from which the connection may be resumed. Alternatively, from Break state 714, receiving the "TS=!Active" signal 715 may trigger a change back to Untrained state 702 to restart the training process.

From Recovery state 716, receiving either the "Timeout" (maximum allowed recovery time elapsed) signal 717 or the "TS=!Active" signal 715 may trigger a change back to Untrained state 702 to restart the training process.

Numerous variations on the wireless-debugging concept may fall within the protected scope. For example, different types of wireless link technologies may be used such as Bluetooth™, Bluetooth Low Energy™, WiFi™, NFC, cellphone networks, or combinations for multiple-link wireless debugging. Diagnostic or debugging signals may include trace protocols JTAG, cJTAG, DCI, serialized VISA (Virtualization of Internal Signals Architecture), or serialized MIPI protocols such as STP or TWP. For compressed wireless debugging, compression algorithms may include LZ4 or Debug Port Profile (DPP).

The preceding Description and accompanying Drawings describe examples of embodiments in some detail to aid understanding. However, the scope of protection may also include equivalents, permutations, and combinations that are not explicitly described herein. Only the claims appended here (along with those of parent, child, or divisional patents, if any) define the limits of the protected intellectual-property rights.

What is claimed is:

1. An apparatus for debugging a remote device, the apparatus comprising:
    wireless communication circuitry;
    a controller coupled to the wireless communication circuitry, the controller to:
        provide a control signal to the wireless communication circuitry for transmission to the remote device being debugged, the control signal being a multi-wire debug protocol signal; and
        identify a first signal and a second signal associated with a response to the control signal from the remote device, the first signal and the second signal being received via the wireless communication circuitry; and
    a de-multiplexer coupled between the wireless communication circuitry and the controller to direct the first signal to the controller via a first path where the first signal is further processed prior to delivery to the controller, and direct the second signal to the controller via a second path where the second signal is delivered to the controller without being further processed.

2. The apparatus of claim 1, wherein the de-multiplexer is to:
    receive a combined signal from the remote device in response to the control signal, via the wireless communication circuitry; and
    separate the combined signal into the first signal and the second signal.

3. The apparatus of claim 1, wherein the first signal includes information associated with a processor core of the remote device for debugging the remote device, and wherein the second signal includes information associated with one or more memory arrays of the remote device for debugging the remote device.

4. The apparatus of claim 1, further comprising a conversion bridge coupled between the de-multiplexer and the controller, wherein the first path includes the conversion bridge and the second path avoids the conversion bridge, and wherein the multi-wire debug protocol signal is a first multi-wire debug protocol signal, the first signal is a serial signal, and the conversion bridge is to convert the first signal from the serial signal to a second multi-wire debug protocol signal.

5. The apparatus of claim 1, further comprising a conversion bridge coupled between the controller and the wireless communication circuitry, wherein the conversion bridge is to convert the control signal from the multi-wire debug protocol signal to a serial signal prior to the transmission of the control signal to the remote device via the wireless communication circuitry.

6. The apparatus of claim 1, wherein the wireless communication circuitry comprises a wireless transmitter/receiver.

7. The apparatus of claim 1, wherein the control signal is a compressed signal, and the first signal and the second signal are compressed signals, and wherein the apparatus further comprises compressor/decompressor circuitry coupled between the wireless communication circuitry and the de-multiplexer, the compressor/decompressor circuitry to:
    compress the control signal, prior to transmission of the control signal by the wireless communication circuitry to the remote device; and
    decompress the first signal and the second signal, wherein the de-multiplexer is to direct the decompressed first signal to the first path and the decompressed second signal to the second path.

8. The apparatus of claim 1, further comprising a storage device coupled to the controller, wherein the controller is further to load a debugging program from the storage device, and wherein the control signal is triggered by the debugging program.

9. A device, comprising:
    a wireless communication block;
    a processor, including a first register, a processor core, and a multiplexer, coupled to the wireless communication block, wherein:
        the processor core includes a second register, and is to:
            identify a control signal received from a remote device via the wireless communication block, the control signal being associated with the remote device debugging the device;
            read first information from the second register of the processor core in response to the control signal;
            read second information from the first register of the processor in response to the control signal; and
            generate a first combined signal that includes the first information and the second information, the first combined signal being in a multi-wire debug protocol format;
        the multiplexer is coupled between the wireless communication block and the processor core, the multiplexer to multiplex the first combined signal with a trace signal received from a trace source to produce a second combined signal; and
        the wireless communication block transmits the second combined signal to the remote device as a response to the control signal to allow the remote device to debug the device;
    wherein the device further comprises a conversion bridge coupled between the wireless communication block and the processor core, wherein the conversion bridge is to convert the first combined signal from the multi-wire debug protocol format to a serial format, and wherein the multiplexer is to multiplex the converted first combined signal with the trace signal.

10. The device of claim 9, wherein the conversion bridge is to further convert the control signal from a serial format to the multi-wire debug protocol format, and wherein the processor core is to identify the converted control signal.

11. The device of claim 10, wherein the trace signal bypasses the conversion bridge.

12. The device of claim 9, wherein the trace signal includes third information read from a memory array.

13. The device of claim 9, wherein the multiplexer is a first multiplexer, and wherein the device further comprises a second multiplexer to multiplex the control signal with other signals for the processor core.

14. The device of claim 9, wherein the control signal is a compressed signal, and the second combined signal is an uncompressed signal, wherein the wireless communication block includes compression/decompression circuitry to:
  decompress the control signal, wherein the processor core is to identify the decompressed control signal; and
  compress the second combined signal prior to its transmission to the remote device.

15. One or more computer-readable media having instructions stored thereon, wherein the instructions, when executed by a device, cause the device to:
  generate a control signal as part of an effort of the device to debug a remote device;
  wirelessly transmit the control signal to the remote device;
  identify a combined signal received from the remote device in response to the control signal;
  de-multiplex the combined signal into a first serial signal and a second serial signal for analysis to diagnose operation of the remote device;
  convert, prior to performance of the analysis, the first serial signal into a multi-wire debug protocol signal, without further processing the second serial signal; and
  perform the analysis using the multi-wire debug protocol signal and the second serial signal to diagnose operation of the remote device.

16. The one or more computer-readable media of claim 15, wherein the instructions, when executed by the device, further cause the device to decompress the combined signal prior to the de-multiplex of the combined signal.

17. The one or more computer-readable media of claim 15, wherein to generate the control signal includes to load a program from a storage device of the device, and wherein the device generates the control signal based on the program.

18. The one or more computer-readable media of claim 15, wherein to generate the control signal includes to identify instructions received from an input/output interface, and wherein the device generates the control signal based on the instructions.

19. The one or more computer-readable media of claim 15, wherein the multi-wire debug protocol signal includes information associated with an internal register of a processor core of the remote device.

20. The one or more computer-readable media of claim 15, wherein the second serial signal includes information associated with a memory array of the remote device.

21. One or more computer-readable media having instructions stored thereon, wherein the instructions, when executed by a device, cause the device to:
  identify a control signal received from a remote device as part of an effort of the remote device to debug the device;
  read first information from an internal register of a processor core of the device in response to the control signal;
  generate a first signal that includes the first information, in a multi-wire debug protocol format;
  read second information from a trace source in response to the control signal;
  generate a second signal that includes the second information, in a serial format;
  convert the first signal from the multi-wire debug protocol format to a serial format;
  multiplex the first signal and the second signal, both in serial format, to produce a combined signal; and
  transmit the combined signal to the remote device in response to the control signal, to allow the remote device to debug the device.

22. The one or more computer-readable media of claim 21, wherein the instructions, when executed by the device, further cause the device to:
  read third information from a register of a processor that includes the processor core; and
  multiplex the third information with the first information and the second information to produce the combined signal.

23. The one or more computer-readable media of claim 21, wherein the instructions, when executed by the device, further cause the device to convert the control signal from a serial signal to a multi-wire debug protocol signal.

* * * * *